US009003784B2

(12) United States Patent
Limbeck et al.

(10) Patent No.: US 9,003,784 B2
(45) Date of Patent: Apr. 14, 2015

(54) ELECTRICAL CONDUCTOR, THERMOELECTRIC GENERATOR AND MOTOR VEHICLE

(75) Inventors: Sigrid Limbeck, Much (DE); Rolf Brück, Bergisch Gladbach (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 203 days.

(21) Appl. No.: 13/114,355

(22) Filed: May 24, 2011

(65) Prior Publication Data

US 2011/0258995 A1 Oct. 27, 2011

Related U.S. Application Data

(63) Continuation of application No. PCT/EP2009/007897, filed on Nov. 4, 2009.

(30) Foreign Application Priority Data

Nov. 24, 2008 (DE) .................... 10 2008 058 779

(51) Int. Cl.
*F01N 3/02* (2006.01)
*H01L 35/34* (2006.01)
(Continued)

(52) U.S. Cl.
CPC ................ *H01L 35/32* (2013.01); *H01L 35/30* (2013.01)

(58) Field of Classification Search
CPC .......... H01L 35/32; H01L 35/30; H01L 35/28
USPC ............ 60/320; 136/201, 205, 208, 209, 210, 136/211, 228
See application file for complete search history.

(56) References Cited

U.S. PATENT DOCUMENTS 3,054,840 A 9/1962 Alsing
3,197,342 A 7/1965 Neild, Jr.
(Continued)

FOREIGN PATENT DOCUMENTS

DE 4303581 A1 8/1994
DE 4429878 A1 3/1996
(Continued)

OTHER PUBLICATIONS

International Search Report of PCT/EP2009/007897, Dated Jul. 23, 2010.

*Primary Examiner* — Kenneth Bomberg
*Assistant Examiner* — Jason Sheppard
(74) *Attorney, Agent, or Firm* — Laurence A. Greenberg; Werner H. Stemer; Ralph E. Locher (57) ABSTRACT

A module for a thermoelectric generator includes first and second ends, at least one inner tube and one outer tube disposed around the outside of the inner tube and at least one thermoelectric element disposed between the inner and outer tubes. The inner and outer tubes are each electrically insulated from the at least one thermoelectric element. At least one electrically conductive first contact is provided on each of the first and second ends, for electrically conductively connecting the at least one thermoelectric element to an electrical conductor. The module can conduct a fluid or coolant flow through the module from the first end to the second end. An electrical conductor, a thermoelectric generator, a motor vehicle and a method for producing a module, are also provided.

6 Claims, 7 Drawing Sheets

(51) Int. Cl.
*H01L 35/30* (2006.01)
*H01L 35/32* (2006.01)

(56) References Cited

U.S. PATENT DOCUMENTS

| | | | |
|---|---|---|---|
| 3,243,869 A | 4/1966 | Sandberg, Jr. | |
| 3,269,872 A | 8/1966 | Thompson | |
| 4,056,406 A | 11/1977 | Markman et al. | |
| 4,095,998 A | 6/1978 | Hanson | |
| 4,595,297 A * | 6/1986 | Liu et al. | 374/29 |
| 5,618,462 A | 4/1997 | Swars | |
| 5,887,426 A | 3/1999 | Brück | |
| 6,096,966 A | 8/2000 | Nishimoto et al. | |
| 6,127,766 A * | 10/2000 | Roidt | 310/306 |
| 7,868,242 B2 | 1/2011 | Takahashi | |
| 2002/0148234 A1* | 10/2002 | Bell | 62/3.3 |
| 2004/0221577 A1* | 11/2004 | Yamaguchi et al. | 60/520 |
| 2008/0028769 A1* | 2/2008 | Goenka | 62/3.7 |
| 2008/0115818 A1* | 5/2008 | Cheng et al. | 136/205 |
| 2009/0113876 A1* | 5/2009 | Grunditz et al. | 60/278 |
| 2009/0133734 A1 | 5/2009 | Takahashi | |
| 2009/0205694 A1* | 8/2009 | Huettner et al. | 136/201 |
| 2010/0116307 A1 | 5/2010 | Hagg et al. | |
| 2011/0005267 A1* | 1/2011 | Lambert et al. | 62/476 |

FOREIGN PATENT DOCUMENTS

| | | |
|---|---|---|
| DE | 102006039024 A1 | 2/2008 |
| EP | 1780807 A1 | 5/2007 |
| GB | 874 660 A | 8/1961 |
| JP | 9036439 A | 2/1997 |
| JP | 9199765 A | 7/1997 |
| JP | 11036981 A | 2/1999 |
| JP | 2006138296 A | 6/2006 |
| JP | 2007260703 A | 10/2007 |
| WO | 2007133069 A1 | 11/2007 |

* cited by examiner

ELECTRICAL CONDUCTOR, THERMOELECTRIC GENERATOR AND MOTOR VEHICLE

CROSS-REFERENCE TO RELATED APPLICATION

This is a continuation, under 35 U.S.C. §120, of copending International Application No. PCT/EP2009/007897, filed Nov. 4, 2009, which designated the United States; this application also claims the priority, under 35 U.S.C. §119, of German Patent Application DE 10 2008 058 779.6, filed Nov. 24, 2008; the prior applications are herewith incorporated by reference in their entirety.

BACKGROUND OF THE INVENTION

Field of the Invention

The present invention relates to a module for a thermoelectric generator for generating electrical energy from a heat difference between a fluid and a coolant, in which the fluid is, in particular, exhaust gas from an internal combustion engine of a motor vehicle. The invention also relates to an electrical conductor, a thermoelectric generator, a motor vehicle and a method for producing a module.

The exhaust gas from an internal combustion engine of a motor vehicle possesses thermal energy which is to be converted through the use of a thermoelectric generator into electrical energy in order, for example, to fill a battery or another energy accumulator and/or to supply required energy directly to electrical consumers. Energy is consequently available to a greater extent when operating the motor vehicle.

Such a thermoelectric generator mostly has a plurality, where appropriate, of module-like thermoelectric converter elements. Thermoelectric materials are of a type which can convert that actual thermal energy into electrical energy (Seebeck effect), and vice versa (Peltier effect). The "Seebeck effect" is based on the phenomenon of the conversion of heat energy into electrical energy and is used for generating thermoelectric energy. The "Peltier effect" is the opposite of the Seebeck effect and is a phenomenon which is accompanied by heat adsorption and is caused in relation to a current flow through different materials. The Peltier effect has already been proposed, for example, for thermoelectric cooling.

Such thermoelectric converter elements preferably have a multiplicity of thermoelectric elements which are positioned between a so-called "hot side" and a so-called "cold side." Thermoelectric elements include, for example, at least 2 semiconductor parallelepipeds (p-doped and n-doped) which are alternately connected on their topside and underside (respectively toward the "hot side" and toward the "cold side") to electrically conductive bridges. Ceramic plates or ceramic coatings and/or similar materials serve for insulating the metal bridges and are therefore preferably disposed between the metal bridges. If a temperature gradient is provided on both sides of the semiconductor parallelepipeds, a voltage potential is thus formed. In that case, heat is absorbed at one contact point ("hot side"), with the electrons of that side passing onto the higher-energy conduction band of the following parallelepiped. On the other side, the electrons can then release energy so as to pass again onto the other side having the lower energy level ("cold side"). Therefore, a current flow can be established in the case of an appropriate temperature gradient.

Attempts have already been made to provide corresponding thermoelectric generators, particularly for use in motor vehicles. However, they were mostly very costly to produce and were distinguished by a relatively large overall size. It was therefore still not possible to achieve compatibility with series production.

SUMMARY OF THE INVENTION

It is accordingly an object of the invention to provide a module for a thermoelectric generator, an electrical conductor, a thermoelectric generator, a motor vehicle and a method for producing a module, which overcome the hereinafore-mentioned disadvantages and at least partially solve the highlighted problems of the heretofore-known devices and methods of this general type. In particular, a module, an electrical conductor and a thermoelectric generator are to be specified which, individually or taken together, constitute a thermoelectric generator that in terms of its overall size is adapted to other structural parts, in particular of a motor vehicle, to such an extent that it can be used in many different ways in motor vehicles. Furthermore, these components are to be capable of being installed in an existing vehicle concept without comprehensive changes and, in particular, of being incorporated exchangeably for components that are already present. Furthermore, the existing problems with regard to the separation of fluid and coolant in such a thermoelectric generator and electrical contacting are also to be solved in such a way that a simple, robust and permanent use of the thermoelectric generator, along with low power loss, becomes possible. A suitable production method for the converter elements or the thermoelectric generator is also to be specified.

With the foregoing and other objects in view there is provided, in accordance with the invention, a module for a thermoelectric generator. The module comprises a first end and a second end for conducting a flow of a fluid or a coolant through the module from the first end to the second end. At least one inner tube and at least one outer tube disposed around and outside of the at least one inner tube are provided. At least one thermoelectric element is disposed between and insulated electrically from the at least one inner tube and the at least one outer tube. At least one electrically conductive first contact is disposed at the first end and at least one electrically conductive first contact is disposed at the second end, for electrically conductively connecting the at least one thermoelectric element to an electrical conductor.

In this case, the module has, in particular, an elongate or tube-like construction and on the inside forms a throughflow cross section for the fluid or coolant. The thermoelectric elements are then disposed around this flow duct formed by the inner tube and, in turn, can be thermally in contact through the outer tube with the coolant or fluid flowing around it. In this case, the inner tube and the outer tube are preferably metallic and, in particular, have a substantially identical cross section which, for example, has a round or polygonal construction. The module preferably has a length of at least 15 to 40 cm [centimeters] and, in particular, has an inside diameter of the inner tube of 2 mm to 15 mm [millimeters]. The outer tube surrounding the inner tube has as small an outside diameter as possible, so that, overall, the module requires only a small amount of construction space.

The at least one thermoelectric element is disposed between the inner tube and outer tube in such a way that, when the module is acted upon by a coolant and by a hotter fluid, there is a temperature difference between the outer tube and the inner tube, so that a current flow is generated by the thermoelectric element. The current quantity which can be generated in this way is dependent, in particular, on the type of thermoelectric element, that is to say, in particular, on the efficiency of the thermoelectric element at a specific temperature and on the prevailing temperatures on the "hot side" of the module and the "cold side" of the module. A plurality of or even a multiplicity of thermoelectric elements are usually placed between the two tubes.

Furthermore, the thermoelectric element is electrically conductively connected to first contacts which are provided at the first end and at the second end. Consequently, a current flow emanating from the respective thermoelectric element toward voltage potentials outside the module can be generated. The electrical energy thus generated can therefore be transferred to a battery or a consumer.

The module is constructed in such a way that a fluid or a coolant is capable of flowing through the inner tube. When the module is used in a thermoelectric generator, a fluid or coolant flows over it around its outer tube, so that there is a heat potential between the outer tube and the inner tube across the thermoelectric element.

In accordance with another feature of the module of the invention, the electrically conductive first contacts form a seal between the outer tube and the inner tube. This means, in particular, that the electrically conductive first contacts form, in the regions where they are disposed between the inner tube and outer tube, a seal with respect to the fluid and/or to the coolant, so that they cannot penetrate into the space between the inner tube and outer tube. This reliably prevents corrosion or a short-circuit of the thermoelectric elements from occurring. Even if it is preferable that the first contacts alone form the seal, it may also be necessary to provide, in addition to the electrically conductive first contacts, further devices for sealing off the first end and/or second end (sealing compound, plugs, etc.).

In accordance with a further feature of the module of the invention, at least one compensation element is provided in the outer tube for equalizing different expansions of the inner tube with respect to the outer tube. What is meant herein by a compensation element is, in particular, a device for length equalization which serves, in the case of a high temperature difference between the outer tube and inner tube, for compensating for a different (material-dependent and temperature-dependent) linear expansion of the inner tube with respect to the outer tube. In this case, the outer tube has as compensation element, in particular, a kind of bellows or concertina, the folds of which extend outward from the circumferential surface of the outer tube. In this case, the compensation element is provided, in particular, so as to run around the circumference of the module, so that the module is subdivided into axial partial regions by the compensation element. In this case, in particular, it is advantageous that the compensation element be produced from an identical material to the outer tube. In particular, metallic alloys are provided as a material for the outer tube and/or the inner tube, for example (high-alloy) chrome/nickel steels, such as WN 1.4301, WN 1.4828 and WN 1.4607 (which designation is particularly according to the German Industrial Standard DIN EN-10027-2), but also aluminum or copper alloys. A steel with the material number (WN) 1.4828 has maximally 0.2% by weight of carbon, 1.5 to 2.5% by weight of silicon, maximally 2% by weight of manganese, maximally 0.045% by weight of phosphorus, maximally 0.03% by weight of sulfur, 19-21% by weight of chromium and 11-13% by weight of nickel. A steel with the material number 1.4301 has maximally 0.07% by weight of carbon, maximally 1% by weight of silicon, maximally 2% by weight of manganese, maximally 0.045% by weight of phosphorus, 17-19.5% by weight of chromium, 8-10.5% by weight of nickel and maximally 0.11% by weight of nitrogen. The materials used for the outer tube and the inner tube may, in particular, also be selected differently, so that an appropriate construction of the module can be achieved, taking into account the contacting of the inner and outer tube with either the hot fluid or the colder coolant, and bearing in mind, for example, the different thermal expansions of the material to be used.

In accordance with an added feature of the module of the invention, the number of compensation elements along the length of the module is fixed as a function of a coefficient of thermal expansion of the material of the outer tube and/or of the material of the inner tube and/or as a function of the temperature difference (during operation) between the outer tube and inner tube. The higher the temperature difference is and/or the higher (or the more different) the coefficient of thermal expansion is, the more compensation elements must be provided along the length of the module.

In accordance with an additional feature of the module of the invention, in particular, in the module, a compensation element is disposed at a distance of 2 cm to 10 cm from the first end and/or from the second end and/or with respect to a further compensation element. It is preferable that the module be configured in such a way that a compensation element running around is provided in each case at a distance of 3 cm to 5 cm from one end as far as the other end.

With the objects of the invention in view, there is also provided an electrical conductor, comprising a plate-shaped electrical conductor body having a first end face, a second end face and a continuous circumferential surface. The electrical conductor body has at least one orifice formed therein for receiving at least one module according to the invention to be electrically conductively connected to an electrode or a housing. The at least one orifice interconnects the first end face and the second end face. Electrically conductive second contacts electrically conductively connect the first contacts of the at least one module to the electrical conductor.

In particular, the electrical conductor proposed herein is constructed to be only 0.5 to 5 mm thick between the first end face and the second end face and, in particular, has no supporting function for placing at least one module in a thermoelectric generator. The electrical conductor has a substantially plate-shaped construction (or is constructed in the manner of a disk or ring) and, in particular, electrical terminals are provided on its first and/or second end face in the region of the orifices and are configured as electrically conductive second contacts for the electrically conductive connection of the first contacts of the module to the electrical conductor. In particular, the electrically conductive second contacts are constructed in such a way that they form around the orifices of the electrical conductor flange-like terminals which can be pushed into the interspace between the inner tube and the outer tube of the module, so that, at least over part of the circumference of the module, they are electrically conductively connected to the electrically conductive first contacts of the module. As a result, an electrical current which is generated through the thermoelectric elements of the module is transmitted by the first contacts to the second contacts and consequently to the electrical conductor.

The electrical conductor is preferably made from the same material as the outer and/or the inner tube and/or the housing of a thermoelectric generator.

The electrical conductor serves for electrically conductively connecting the thermoelectric elements of a module, in particular, to a housing (as an electrical ground) of a thermoelectric generator so that, in particular, electrically conductive contact with ground becomes possible. Conversely, for example, a virtually identically configured conductor can be electrically conductively connected to a (positive) electrode.

The electrical conductor may also be provided for electrically conductively connecting the thermoelectric elements of a module, over its plate-shaped extent, to an electrode which is connectable to current lines outside the housing of a thermoelectric generator. For this purpose, the electrical conductor must be disposed so as to be insulated electrically with respect to the housing. With regard to execution of a sealing or insulating connection between an electrical conductor and a housing and, in particular, with regard to a sealing and insulating leadthrough of an electrode through a housing of a thermoelectric generator, attention is drawn to German Published, Patent Application DE 43 03 581 A1, corresponding to U.S. Pat. No. 5,618,462, which is fully incorporated herein by reference. The casing tubes described therein are to be equated in functional terms with the housing of the present invention, and the electrodes mentioned therein will be electrically conductively connected to the electrical conductor provided in this invention.

Sealing of a leadthrough of an electrode or current conductor through the housing of a thermoelectric generator outwardly and/or of an electrical conductor inside a housing, particularly with regard to a gaseous fluid, in particular an exhaust gas from an internal combustion engine, is proposed.

With the objects of the invention in view, there is furthermore provided a thermoelectric generator, comprising a housing, at least one fluid inlet and at least one fluid outlet, at least one coolant inlet and at least one coolant outlet, and at least one module according to the invention being received at least at the first end or the second end via the at least one inner tube or via the at least one outer tube, in an electrical conductor according to the invention.

It is preferable that a plurality of modules are provided, each module being connected, for example, at one end through the inner tube to the electrical conductor according to the invention and, on the opposite side, each module being connected at the other end through the outer tube to the electrical conductor according to the invention. One electrical conductor (the first electrical conductor) can then preferably be connected to the housing forming the electrical ground, and the other electrical conductor (the second electrical conductor) can be connected to the electrode.

Instead of the electrical conductor according to the invention, basically other electrically conductive connections of the modules to an electrode or to a housing, for example cable connections, may also be provided. A version with an electrical conductor according to the invention is to be preferred in this case, because it has good fatigue strength and can therefore ensure a permanent functioning capacity and consequently freedom from maintenance of the thermoelectric generator, particularly when disposed in a region through which a fluid or coolant flows.

According to an especially preferred embodiment, the thermoelectric generator has between 10 and 50 modules which are disposed next to one another (in parallel) and are connected at their respective end in each case by an electrical conductor to one another and/or to an electrode and/or to a housing. A configuration of the thermoelectric generator with 20 to 30 modules is most especially preferred.

A fluid inlet and a fluid outlet are provided, in particular, on a first end face or on a second end face of the thermoelectric generator, so that the fluid flows through the modules. A coolant inlet and a coolant outlet are then disposed correspondingly on a circumferential surface of the housing, so that the coolant flows over the modules on their outer surface. If appropriate, the inlet/outlet for fluid and coolant is reversed, so that a coolant flows through the modules and a fluid flows over the modules on their outer surface.

The fluid inlet and fluid outlet may be constructed, in particular, as part of an exhaust gas system or exhaust gas line. However, it is also possible, in particular, to provide a plurality of fluid inlets and/or a plurality of fluid outlets.

The electrical conductors are provided inside the housing of the thermoelectric generator, so that an electrical current generated within the modules by thermoelectric elements is conducted through the electrical conductors toward the housing or toward an electrode outside the housing.

According to an especially advantageous embodiment, the entire housing of the thermoelectric generator may be constructed to be electrically insulated with respect to further components of a motor vehicle or of a surrounding system, in particular with respect to an exhaust gas system connected to the housing. In this regard, attention is drawn to German Published, Patent Application DE 44 29 878 A1 corresponding to U.S. Pat. No. 5,887,426, which is fully incorporated herein by reference in this respect and which already discloses, in particular, the insulation of an exhaust gas treatment unit with respect to an exhaust gas system connected thereto.

According to an advantageous development, the thermoelectric generator is provided as a replacement for a conventional heat exchanger, in particular for a heat exchanger of an internal combustion engine. The inlets/outlets for a fluid or coolant can be adopted, unchanged, from the heat exchanger, with the thermoelectric generator continuing to provide at least one current electrode (plus pole) which is intended for discharging the electrical current generated in the thermoelectric generator.

In accordance with another feature of the thermoelectric generator of the invention, at least one supporting element is provided which is connected to the housing and the at least one module and which forms with the housing and the at least one module a seal with respect to a fluid and/or a coolant. The supporting device is constructed, in particular, similarly to the electrical conductor according to the invention, as a plate element with orifices and is connected in a materially integral, form-locking and/or force locking manner to the outer tube and/or the inner tube of the module and to the housing. A form-locking connection is one which connects two elements together due to the shape of the elements themselves, as opposed to a force-locking connection, which locks the elements together by force external to the elements.

The supporting element serves for fixing and configuring the individual modules in a housing of a thermoelectric generator and therefore for making it possible for the modules to be supported in the housing so as to ensure fatigue strength. Furthermore, the supporting elements serve, in particular, for sealing-off within the housing, between the region through which a fluid flows and the region through which a coolant flows. In this case, too, sealing is executed, in particular, by using further special sealing devices.

According to an especially advantageous refinement of this embodiment of the invention, the functions of at least one supporting element and of an electrical conductor are combined in one structural part. As a result, the supporting function of the individual modules as well as sealing and electrical conduction of the electrical current generated in the module, can be carried out by one structural part.

In accordance with a further feature of the invention, the housing of the thermoelectric generator has at least one compensation element. This compensation element, too, is constructed, in particular, in the same way as the already described compensation element of the module. In this case, therefore, in particular, a bellows or concertina is also to be provided which, in particular, allows thermal expansions with respect to a different expansion of the modules disposed in the housing.

In accordance with an added feature of the thermoelectric generator of the invention, the at least one module has at least one structure for influencing the flow at least of the fluid and/or of the coolant and/or for the conduction of heat at least from the fluid and/or the coolant toward the inner tube or the outer tube. Such structures are intended for flow ducts and flow paths and are, for example, elements for influencing the flow and/or guide vanes and/or heat conduction structures. These structures may be provided on the outer face of the outer tube and/or on the inner face of the inner tube, so that the fluid and/or coolant flowing over these faces can be influenced correspondingly.

According to an especially advantageous development, the thermoelectric generator may have different types of thermoelectric elements.

According to a further advantageous embodiment, the power loss of the thermoelectric generator amounts to at most 10%. In this case, the power loss is the fraction of the electrical power which is generated by the thermoelectric elements and which is lost as thermal output within the thermoelectric generator as a result of transition resistances in the electrical conductors between the thermoelectric elements.

Moreover, there may also be provision for additional cooling for at least part of a module to be present. Most especially preferably, the additional cooling is a (electrical or electromechanical) reversing circuit of the thermoelectric elements, so that they act as Peltier elements. They can then consequently cool themselves in the event that exhaust gas which is too hot flows through the thermoelectric generator.

With the objects of the invention in view, there is also provided a motor vehicle, comprising an internal combustion engine, an exhaust gas line, and a thermoelectric generator according to the invention for conducting a flow of exhaust gas through the at least one module according to the invention. When a thermoelectric generator is disposed in this way in an exhaust gas line of a motor vehicle, there is, in particular, also provision for the coolant to flow through the module and, correspondingly, for the exhaust gas to flow over the modules inside the housing of the thermoelectric generator. In particular, the coolant used is cooling water, although other coolants, such as oils, may also be used.

With the objects of the invention in view, there is furthermore provided a motor vehicle, comprising an internal combustion engine, an exhaust gas line, an exhaust gas recirculation line, and a thermoelectric generator according to the invention disposed in the exhaust gas recirculation line.

With the objects of the invention in view, there is additionally provided a method for producing a module. The method comprises:

a1) providing an inner tube having a cross section and an outer circumferential surface;

a2) coating at least part of the outer circumferential surface with:
  i) a dielectric and
  ii) a conductor track material for producing conductor tracks;

a3) applying semiconductor material or at least one thermoelectric element on the dielectric and the conductor track material;

b1) providing an outer tube having an inner surface;

b2) applying:
  i) a dielectric and
  ii) conductor track material for producing conductor tracks, to at least part of the inner surface of the outer tube; and c1) combining the outer tube and the inner tube.

Subprocesses a) and b) given above may be executed separately and independently of one another in time. The process steps within the subprocesses must be carried out in the successive order given.

It is especially advantageous for the coating of the inner tube or the outer tube with a dielectric to be carried out through the use of an immersion bath. In order to carry out the coating of the inner tube or the outer tube with a conductor track material, the tube already coated with the dielectric is then dipped into a conductor track material immersion bath or the conductor track material is applied, for example, through the use of screen printing, in particular, to the outer circumferential surface of the inner tube.

The application of semiconductor material may also take place in this case in an immersion bath. Furthermore, the semiconductor material may also be pushed in the form of differently doped annular elements onto the inner tube, so that differently doped semiconductors can be connected together in the axial direction of the module by electrically conductive connection through the use of the electrical conductor tracks so as to form an electrothermal element.

In a preferred embodiment, in addition to application as semiconductor material, a thermoelectric element may also be applied directly to the correspondingly prepared inner tube and, depending on the embodiment of the thermoelectric element, can be connected in parallel or in series to other thermoelectric elements. In this case, it is preferable that as large a part as possible of the circumferential surface of the inner tube be provided with thermoelectric elements. Particularly when rectangular cross sections of an inner tube are used, the larger side faces are covered with thermoelectric elements and the smaller side faces are left free, so that a closer configuration of individual modules inside a housing of a thermoelectric generator becomes possible.

Since the inner surface of the outer tube is coated with a dielectric and with conductor track material and the cross sections of the outer tube are usually so small that it is not possible for the inner surface to be machined, dielectric and conductor track material are in this case applied to the inner surface of the outer tube preferably in an immersion process.

According to an advantageous embodiment of the method, in order to produce conductor tracks in preferred regions of the outer tube, so that applied thermoelectric elements or correspondingly doped semiconductor material can be correspondingly connected on the inner tube, after step b2) i) an inner profiled tube composed of conductor track material is pushed into the outer tube having a smooth inner face and having the dielectric coating in a step b2) ii) in order to produce the conductor tracks and is connected, in particular soldered, to the outer tube. In this case, the inner profiled tube has a first minimum inside diameter and outward profiling, that is to say is in contact only in partial regions with the outer tube or with the dielectric coating. That is to say, after steps i) and ii) of step b2), the inner profiled tube forms a first minimum inside diameter through the use of the (smooth) inner face of the inner profiled tube, which is widened in a step b3) (in particular, through the use of a drilling-out process). In this case, the material of the inner profiled tube is stripped off to such an extent that the material of the inner profiled tube is present only in partial regions on the outer tube and, correspondingly, conductor tracks are formed. Thus, a (virtually) planar surface is generated on the inner face of the outer tube, so that, when the outer tube and the inner tube are combined, a corresponding conductor track configuration is formed both on the outer face or surface of the inner tube and on the inner face or surface of the outer tube and a corresponding current flow path can be generated through the thermoelectric elements.

In accordance with another mode of the method of the invention, the module has a first end and a second end and the electrical conductor tracks are electrically conductively connected at the first end and the second end in each case to at least one electrical contact. In this case, the electrical contact herein may be constructed as a cable or the like which can conduct the electrical current generated by the thermoelectric elements to regions outside the module. In particular, however, the electrical contact is constructed in such a way that an, in particular, gas-tight seal is generated between the outer tube and inner tube, and the first electrical contact is electrically conductively connected to the proposed electrical conductor according to the invention.

In accordance with a concomitant mode of the method of the invention, the semiconductor material applied to the outer circumferential surface of the inner tube is doped, after step a3), in a further step a4), so that at least one thermoelectric element is formed in this way.

Other features which are considered as characteristic for the invention are set forth in the appended claims, noting that the features listed individually in the claims may be combined with one another in any technologically expedient way and disclose further refinements of the invention.

Although the invention is illustrated and described herein as embodied in a module for a thermoelectric generator, an electrical conductor, a thermoelectric generator, a motor vehicle and a method for producing a module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
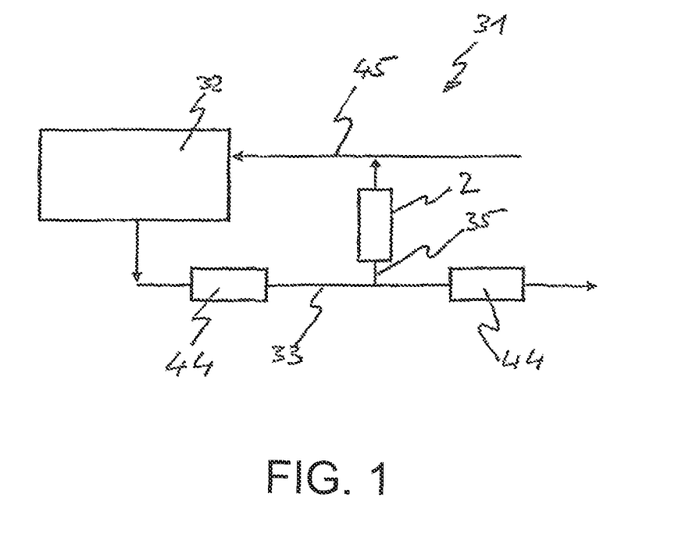
FIG. 1 is a block diagram showing an integration of a thermoelectric generator in a motor vehicle.

Referring now in detail to the figures of the drawing for explaining the invention and the technical field in more detail by showing particularly preferred structural variants to which the invention is not restricted, and first, particularly, to FIG. 1 thereof, there is seen a diagrammatic illustration of a preferred intended use of a thermoelectric generator 2. A motor vehicle 31 with an internal combustion engine 32 is shown in this case. Exhaust gas generated in the internal combustion engine 32, for example a gasoline engine or diesel engine, flows through an exhaust gas line 33, through different exhaust gas treatment units 44 and through the thermoelectric generator 2. In this case the thermoelectric generator 2 is disposed in an exhaust gas recirculation line 35 connecting the exhaust gas line 33 to an air supply 45 of the internal combustion engine 32. It is advantageous to install the thermoelectric generator 2 in an exhaust gas recirculation line 35, especially because heat exchangers are usually provided there, which can then be replaced by a thermoelectric generator 2. As a result, no additional exhaust gas treatment units 44 are additionally integrated into the exhaust gas system of an internal combustion engine 32 and therefore, in particular, the existing spatial conditions of a motor vehicle 31 are utilized.

Figures 2, 3, 4:
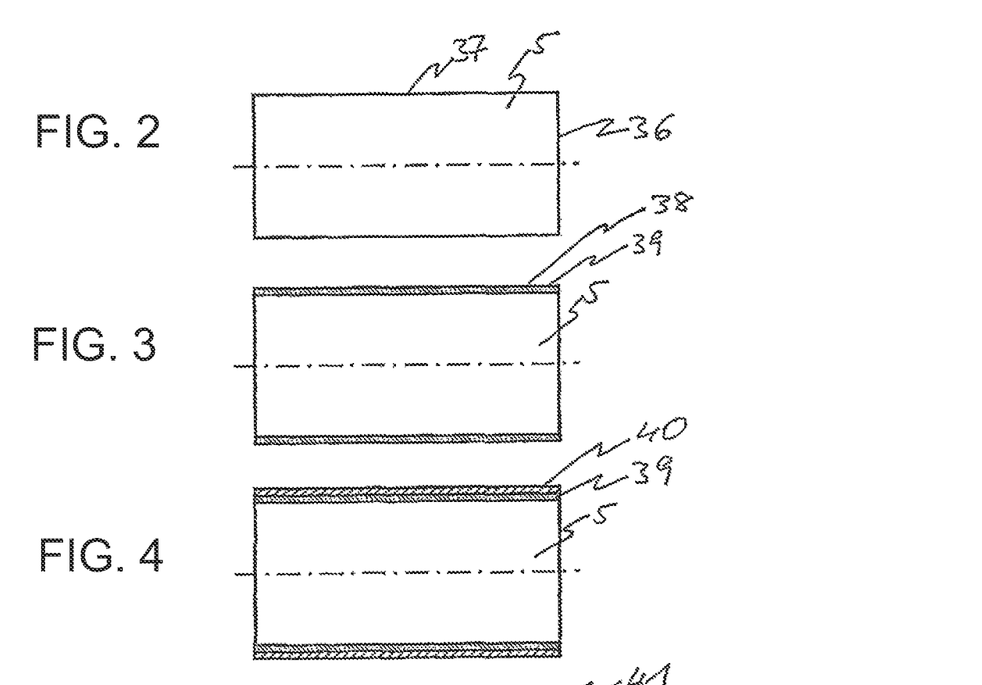
FIG. 2 is a diagrammatic, plan view of an inner tube according to step a1)
FIG. 3 is a longitudinal-sectional view of an inner tube according to step a2) i)
FIG. 4 is a longitudinal-sectional view of an inner tube according to step a2) ii)

FIGS. 2 to 12 illustrate the production of a module 1 of the thermoelectric generator 2. In this case, FIG. 2 shows an inner tube 5 with an outer circumferential surface 37 and a cross section 36 which, in particular, may have a round or polygonal, especially rectangular, construction.

FIG. 3 shows the inner tube 5 according to method step a2) i) for producing the module 1, with the outer circumferential surface 37 of the inner tube 5 having been provided in this case with a coating of a dielectric 39. In particular, in this case, the entire outer circumferential surface 37 of the inner tube 5 is not coated with a dielectric 39, but instead only a part 38 of the outer circumferential surface 37. Particularly in the case of flat rectangular tubes, only larger side faces then have to be coated so that, when a plurality of modules 1 are used in a thermoelectric generator, a closer configuration of the modules 1 can be implemented.

FIG. 4 shows the inner tube 5 according to method step a2) ii), with a further coating of conductor track material 40 having been applied on the outside to the coating of dielectric 39. The conductor track material 40 is illustrated herein as a continuous coating but, even at this stage, subsequently used structures of conductor tracks 19 may be applied (for example, through the use of a screen printing method seen in FIG. 5).

Figure 5:
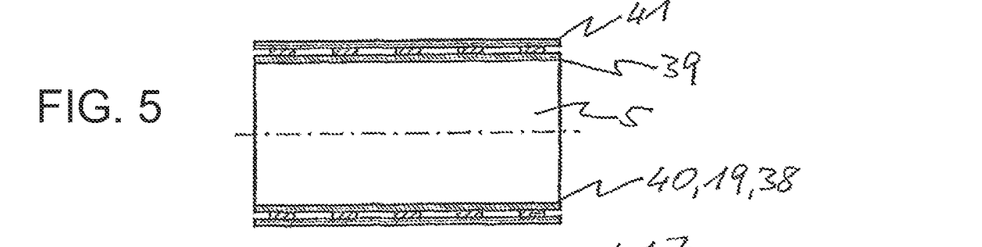
FIG. 5 is a longitudinal-sectional view of an inner tube according to step a3) with semiconductor material.

FIG. 5 shows the inner tube 5 with the coating of dielectric 39, and with the coating of conductor track material 40 which is illustrated herein as already formed conductor tracks 19 that cover only the part 38 of the circumferential surface 37 of the inner tube 5. In addition, the inner tube 5 has a coating of semiconductor material 41 which has been applied in this case, for example, through the use of an immersion process.

The inner tube 5 is therefore illustrated after method step a3). Gaps shown therein between the dielectric 39 and semiconductor material 41 are inserted merely to illustrate the position of the conductor tracks 19. In fact, the conductor tracks 19 are made so thin that the semiconductor material 41 lies, on one hand, on the conductor tracks 19 and, on the other hand, on the dielectric 39.

Figure 6:
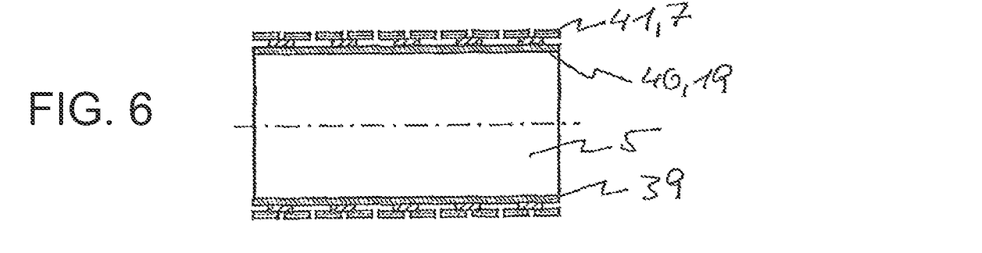
FIG. 6 is a longitudinal-sectional view of an inner tube according to step a3) with thermoelectric elements.

FIG. 6 shows a further illustration of the inner tube 5 after method step a3), with thermoelectric elements 7 having been applied in this case to the already existing coating of dielectric 39 and conductor track material 40, with conductor tracks 19 already being generated in this case. These thermoelectric elements 7 may also be formed by semiconductor material 41 which, particularly according to a further method step after method step a3), is divided by machining into individual segments which, in particular, are doped in a later step a4), so that a current path along the outer circumferential surface 37 of the inner tube 5 through the doped semiconductor material 41, which is then a thermoelectric element 7, can be formed. The segmenting may also take place solely by doping according to step a4), so as to form a continuous semiconductor layer, through the use of which a current path can be generated as a result of doping.

Figure 7:
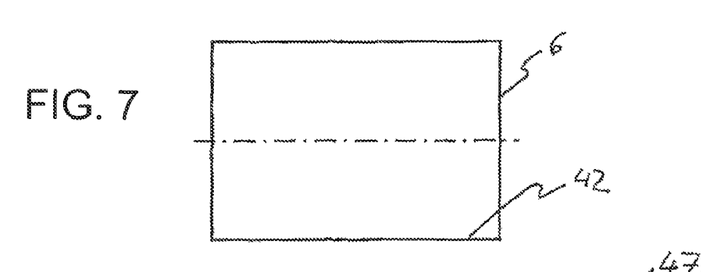
FIG. 7 is a plan view of an outer tube according to step b1)

FIG. 7 shows an outer tube 6 with an inner surface 42 according to method step b1). In this case, the inside diameter of the outer tube 6 is selected in such a way that, after the individual method steps to be carried out, the inner tube 5 and the outer tube 6 can be pushed together and give rise to a functional module having mutually contacting surfaces.

Figure 8:
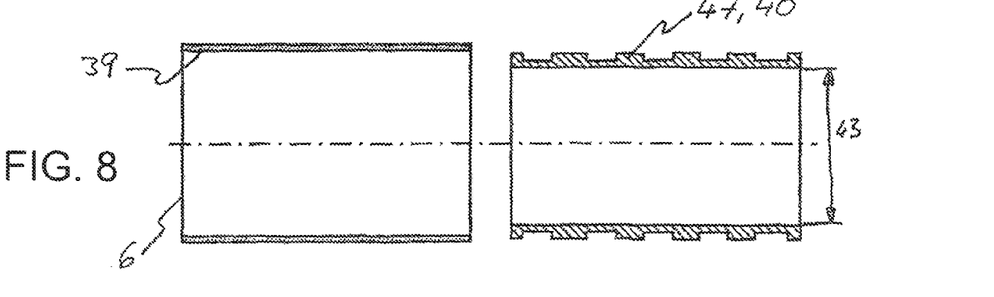
FIG. 8 is a longitudinal-sectional view of the outer tube according to step b2) i)

FIG. 8 shows the outer tube 6 with a coating of dielectric 39 according to method step b2) i), in the left half of the figure. An inner profiled tube 47, which is illustrated in the right half of the figure, is composed of conductor track material 40. The inner profiled tube 47 has a first minimum inside diameter 43.

Figure 9:
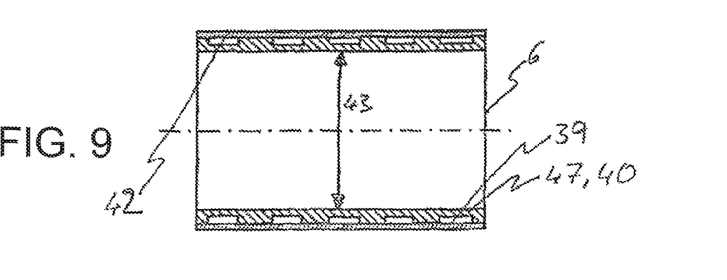
FIG. 9 is a longitudinal-sectional view of the outer tube before step b3)

FIG. 9 shows the outer tube 6 with a further layer composed of conductor material 40 for generating conductor tracks, which lies on the inside of the coating of dielectric 39. According to FIG. 8, this layer may be generated by combining the outer tube 6 and the inner profiled tube 47 made from conductor track material 40. The profiling of the inner profiled tube 47 is formed outwardly, so that the inner profiled tube 47 lies only in partial regions against the inner surface 42 of the outer tube 6 or against the dielectric 39. FIG. 9 therefore shows the outer tube 6 before a step b3) in which the first minimum inside diameter 43 is then widened.

Figure 10:
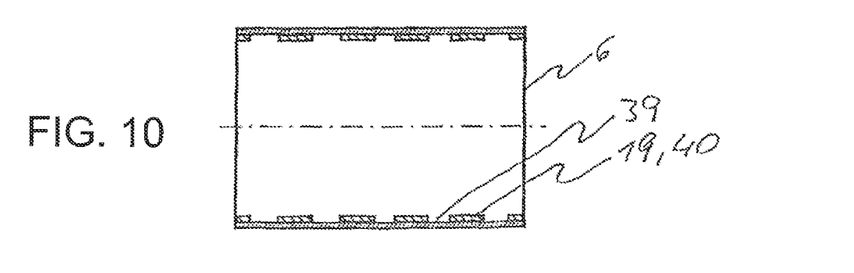
FIG. 10 is a longitudinal-sectional view of the outer tube according to step b2) ii) or according to step b3)

FIG. 10 shows the outer tube 6 according to a step b2) ii) or after a step b3), in which the minimum inside diameter 43 (see FIG. 9) has been enlarged, for example through the use of a drilling-open method, and then a (virtually) smooth inner surface is generated, since the conductor tracks 19 have only a very low elevation with respect to the dielectric 39. The dielectric 39 and the conductor track material 40 alternate with one another on this inner surface or a configuration of the dielectric 39 and the conductor track material 40 which corresponds to the inner profiled tube 47 (see FIG. 9) is formed. The conductor track material 40 is then present only in partial regions and forms corresponding conductor tracks 19.

Figure 11:
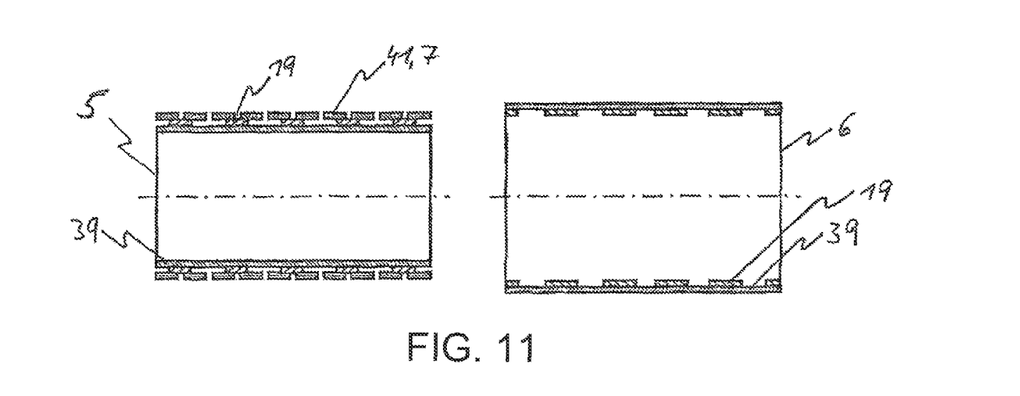
FIG. 11 is a longitudinal-sectional view of the inner tube and the outer tube before combining according to step c1)

FIG. 11 shows the inner tube 5 after method step a3) or after method step a4) in the left half of the figure, with the coating of dielectric 39 having been carried out and the conductor tracks 19 being formed. Furthermore, thermoelectric elements 7 or doped semiconductor material 41 are disposed on the surface in such a way that, after the inner tube 5 is combined with the outer tube 6, as illustrated in the right half of the figure, with a structure of the dielectric 39 and the conductor tracks 19, a current path is formed by the module 1 which is thus produced.

Figure 12:
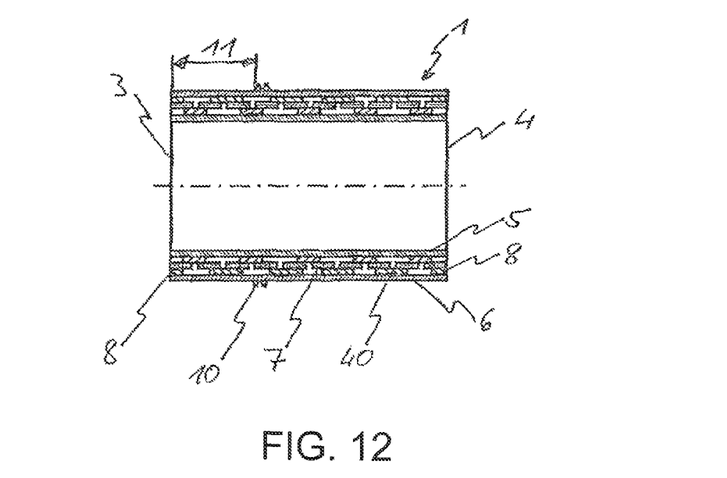
FIG. 12 is a longitudinal-sectional view of a further embodiment of a module for a thermoelectric generator.

FIG. 12 shows the module 1 which has been produced by the combining (according to step c1)) of the inner tube 5 after method steps a3) or a4) and the outer tube 6 after method step b2) ii) or b3). The module 1 has a first end 3 and an oppositely disposed second end 4 as well as thermoelectric elements 7 being disposed between the outer tube 6 and the inner tube 5 in such a way that at least one electrical current path from the first end 3 to the second end 4 is formed. It is also possible in this case for a plurality of parallel current paths to be formed. Furthermore, first contacts 8 are formed, particularly by the conductor track material 40, at the first end 3 and at the second end 4 and allow electrical contacting with components outside the module 1, so that an electrical current which has been generated by a temperature difference between the outer tube 6 and the inner tube 5 can be discharged from the module 1. Furthermore, the outer tube 6 has at least one compensation element 10 which is disposed at a distance 11 at least from the first end 3. This compensation element 10 serves for making it possible, as a result of the temperature difference between the outer tube 6 and the inner tube 5, to compensate for a different thermal expansion of the outer tube 6 with respect to the inner tube 5, so that no structural damage to the module 1 occurs.

Figure 13:
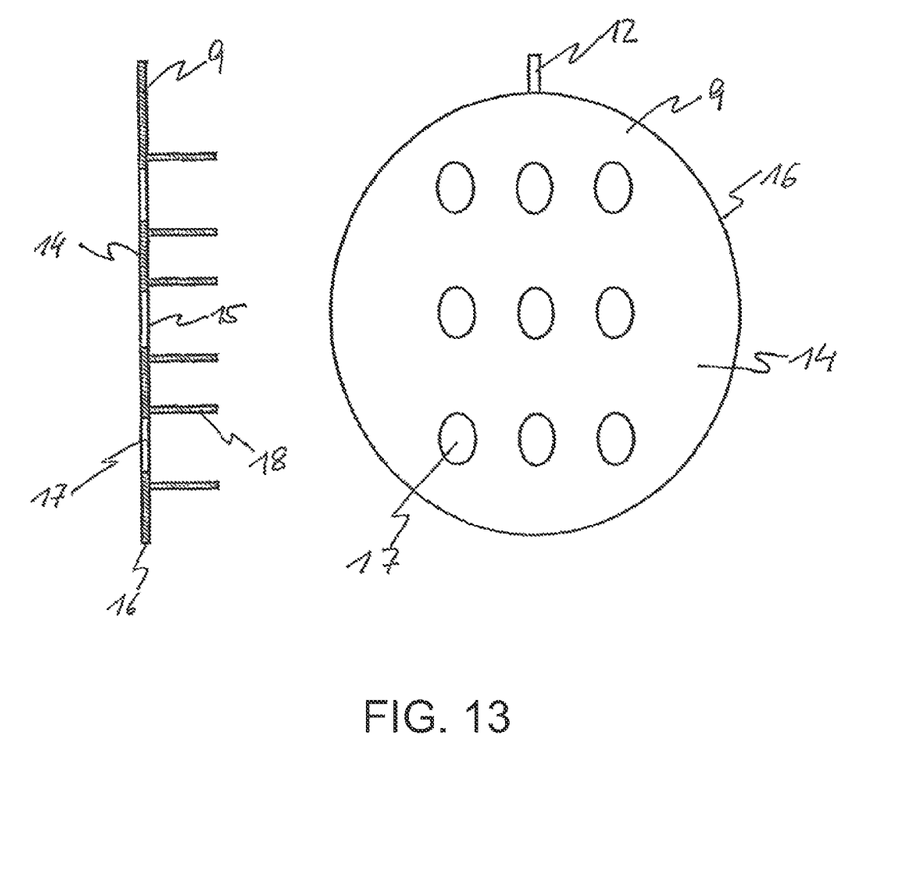
FIG. 13 includes a cross-sectional view and a top-plan view of an embodiment of an electrical conductor.

FIG. 13 shows two views of an electrical conductor 9 which can be used, in particular, in a thermoelectric generator. The electrical conductor 9 is illustrated in a cross-sectional view in the left half of the figure and in a top view in the right half of the figure. In this case, the electrical conductor 9 has a plate-shaped electrical conductor body 14-17 with a first end face 14 and a second end face 15 which are connected to one another by orifices 17. Furthermore, the electrical conductor 9 has an outer edge, margin or circumferential surface 16. Moreover, the electrical conductor 9 is connected, in particular, to an electrode 12, so that an electrical current which flows through the electrical conductor 9 can be tapped through the electrode 12. In this case, the outer edge 16 is configured in such a way that, in particular, either electrical insulation of the edge 16 with respect to a housing of a thermoelectric generator 2 or an electrically conductive connection to the housing can be implemented. Moreover, the electrical conductor 9 has, in particular, second contacts 18 which are electrically conductively connected to the electrical conductor 9. These may, in particular, be connected in a materially integral manner to the latter. In particular, the second contacts 18 are constructed in such a way that they at least partially surround the orifices 17. In this case, the second contacts 18 are provided for the electrically conductive connection of the electrical conductor 9 to the modules, so that an electrical current generated in the modules can be discharged through the electrical conductor 9 toward components of a motor vehicle or of a system.

Figure 14:
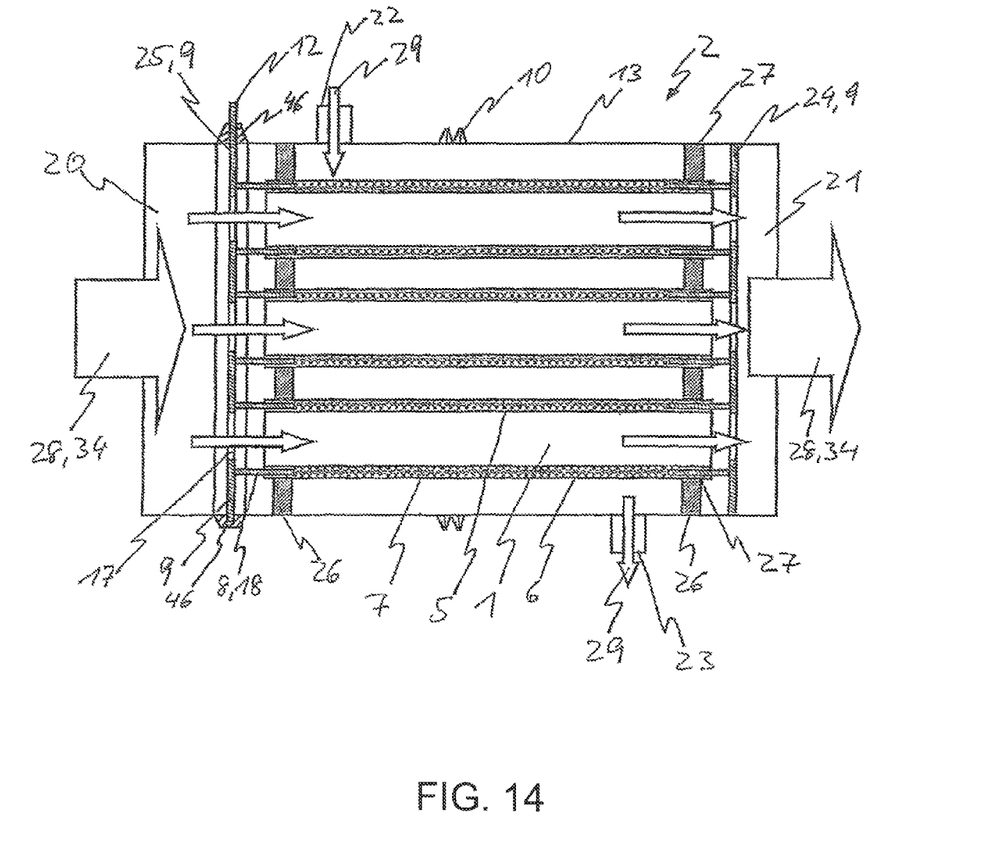
FIG. 14 is a longitudinal-sectional view of a further embodiment of a thermoelectric generator.

FIG. 14 shows a first embodiment of a thermoelectric generator 2. This thermoelectric generator 2 has a housing 13 in which a plurality of modules 1 are provided. In this case, the housing 13 has a fluid inlet 20 and a fluid outlet 21 as well as a coolant inlet 22 and a coolant outlet 23. The housing 13 of the thermoelectric generator 2 therefore has a fluid 28, in particular an exhaust gas 34, flowing through it from the fluid inlet 20 to the fluid outlet 21 and, at the same time, a coolant 29 which flows from the coolant inlet 22 to the coolant outlet 23. The coolant 29 and the fluid 28 are sealed off from one another in this case, in particular by supporting elements 26 in conjunction with the housing 13 and/or with the modules 1. The supporting elements 26 are provided, in particular, for fixing the modules 1 inside the housing 13 of the thermoelectric generator 2.

The modules 1 are constructed with an inner tube 5, an outer tube 6 as well as thermoelectric elements 7 disposed therebetween, so that an electrical current is generated as a result of a temperature difference, generated by the fluid 28 and the coolant 29, between the outer tube 6 and the inner tube 5 of the module 1 and can be discharged from the housing 13 through electrical conductors 9. In this case, preferably, a first electrical conductor 24 is provided which is electrically conductively connected to the housing 13 and the module 1 or to the thermoelectric elements 7 disposed therein. Furthermore, a second electrical conductor 25 is provided which is likewise electrically conductively connected to the modules 1 and, in particular, to the thermoelectric elements 7 of the module 1 and can thus discharge a current, generated as a result of the temperature difference, to outside the housing 13 through an electrode 12. For this purpose, the second electrical conductor 25 is disposed so as to be electrically insulated by insulation 46 with respect to the housing 13 of the thermoelectric generator 2. The electrical conductors 9, 24, 25 in this case are electrically conductively connected through first contacts 8 and second contacts 18 in each case to the thermoelectric elements 7 of the individual modules 1. The first contacts 8 or the second contacts 18 may in this case be implemented jointly in one structural part, so that this structural part is disposed captively, for example by welding or soldering, either on the electrical conductor 9 or on the module 1. The region between the inner tube 5 and the outer tube 6 of the module 1 in this case is sealed off at least through the use of the first contacts 8 or the second contacts 18, so that the fluid 28 or the exhaust gas 34 cannot penetrate into this interspace and possibly have a corrosive effect.

As illustrated, the fluid 28 flows into the housing 13 of the thermoelectric generator 2 through a fluid inlet 20 and flows through orifices 17 of the electrical conductor 9 into the inner tubes 5 of the individual modules 1. After flowing through the modules 1, the fluid 28 flows anew through the orifices 17 of a further electrical conductor 9 and through a fluid outlet 21 out of the thermoelectric generator. Moreover, a coolant 29 flows over the modules 1 over the surface of the outer tubes 6, so that a temperature difference between the inner tube 5 and the outer tube 6 is formed. In order to compensate for possible thermal expansion, particularly of the modules 1, at least one compensation element 10 is also provided in the housing 13 and allows for expansion of the housing 13 of the thermoelectric generator 2.

Figure 15:
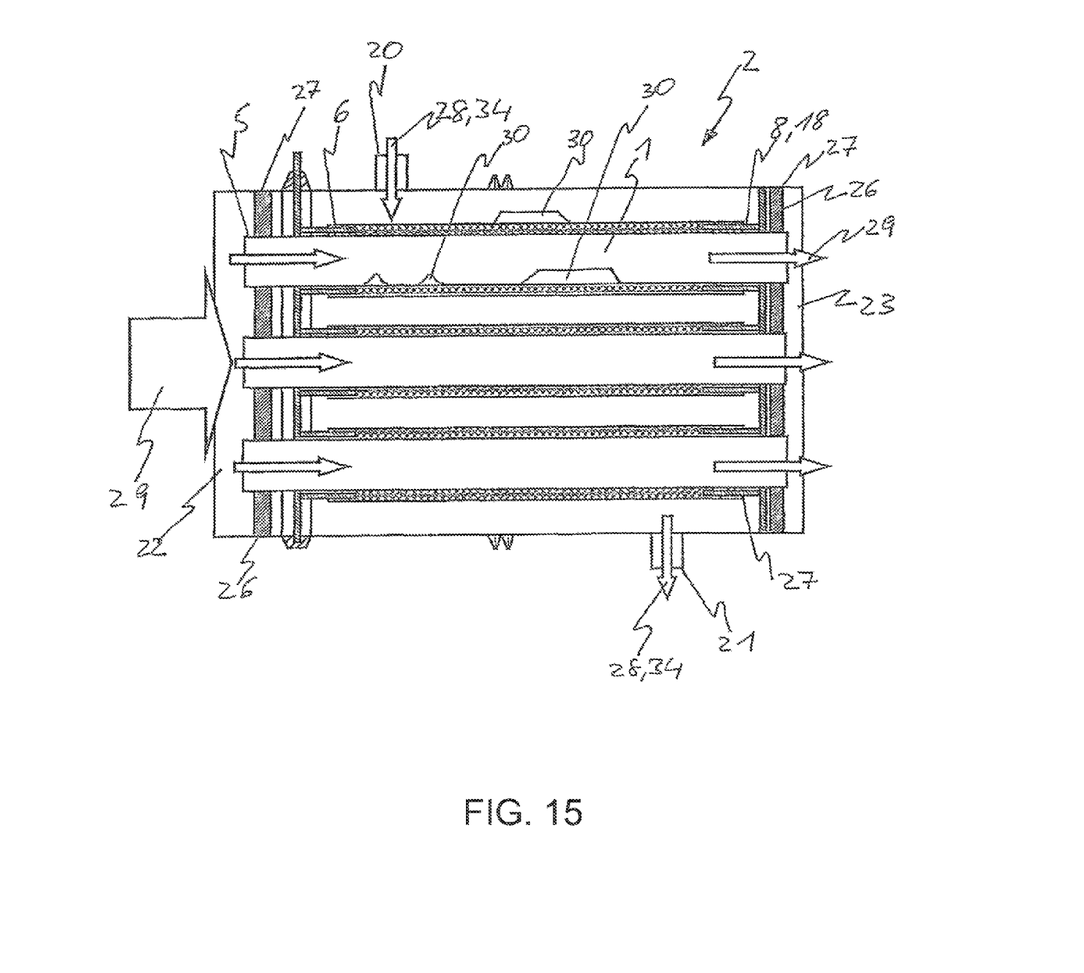
FIG. 15 is a longitudinal-sectional view of yet another embodiment of a thermoelectric generator.

FIG. 15 shows a second embodiment of the thermoelectric generator 2 in which, in this case in particular, the fluid inlet 20 and the fluid outlet 21 as well as the coolant inlet 22 and the coolant outlet 23, have been interchanged. A coolant 29 therefore flows in this case in the modules 1 through the inner tubes 5 and a fluid 28 or an exhaust gas 34 is conducted over the surface of the outer tubes 6. In this case too, supporting elements 26 are provided which form a seal 27, along with the housing 13 and the modules 1, between the region of the housing 13 which is acted upon by a coolant 29 and the region of the housing 13 which is acted upon by a fluid 28. The supporting elements 26 are connected in this case to the inner tubes 5 of the modules 1, so that they are supported in the housing 13. What is achieved thereby is that the intermediate region between the outer tube 6 and inner tube 5 has to be sealed off by at least first contacts 8 or second contacts 18 solely against the fluid 28 or exhaust gas 34. Furthermore, structures 30 are provided in this case on the outer surface of the outer tube 6 and allow an improved conduction of heat between the fluid 28 or exhaust gas 34 and the outer tube 6. Similar structures 30 are also provided inside the inner tubes 5 and cause turbulence of a fluid 28 flowing through or of a coolant 29 flowing through, so that a better transfer of heat between the fluid 28 or coolant 29 and the inner tube 5 becomes possible. The structures 30 may also be provided as heat conduction elements, so that the transfer of heat between the inner tube 5 and the fluid 28 or the coolant 29 is improved.

The supporting elements 26 shown in FIGS. 14 and 15 may, together with the electrical conductors 9, be constructed in each case as common structural parts. The supporting function of the modules 1, the function of a seal 27 with the housing 13 and the modules 1 and the conduction of an electrical current, are then implemented by one structural part.

Furthermore, the first electrical conductor 24 may also be constructed to be insulated with respect to the housing 13 and the housing 13 may be constructed to be insulated with respect to the exhaust gas system of the internal combustion engine 32. As a result, the modules 1 would be constructed to be independent in terms of voltage with respect to the exhaust gas system and could be connected correspondingly to the ground of the motor vehicle or to the minus pole of a current feeder.

The invention claimed is:

1. A thermoelectric generator, comprising:
   a housing;
   at least one fluid inlet and at least one fluid outlet disposed at said housing;
   at least one coolant inlet and at least one coolant outlet disposed at said housing;
   an electrical conductor including a plate-shaped electrical conductor body having a first end face, a second end face, a circumferential surface, and at least a plurality of orifices interconnecting said first and second end faces; and
   a plurality of modules each including a first end, a second end, first contacts, an inner tube, an outer tube and thermoelectric elements disposed between said inner and outer tubes, said thermoelectric elements electrically interconnected in series and electrically isolated from said inner and outer tubes, said plurality of modules configured to generate an electrical current as a result of a temperature difference between said inner and outer tubes generated by a fluid and a coolant and said plurality of modules configured to discharge the electrical current through an electrode toward components of a vehicle or a system, each of said plurality of modules being received in a respective one of said plurality of orifices at least at said first end or said second end by way of said inner tube or said outer tube;
   first and second electrical conductors each connected to a respective one of said first and second ends and electrically conductively connecting said plurality of modules in parallel between said electrode and said housing forming an electrical ground; and
   said first and second electrical conductors each having respective electrically conductive second contacts for electrically conductively connecting said first contacts of said plurality of modules to said first and second electrical conductors.

2. The thermoelectric generator according to claim 1, which further comprises at least one support connected to said housing and to said plurality of modules and forming a seal with said housing and said plurality of modules against the fluid and the coolant.

3. The thermoelectric generator according to claim 1, wherein said housing has at least one compensator.

4. The thermoelectric generator according to claim 1, wherein said plurality of modules are each structured in at least one location for influencing a flow of the fluid or of the coolant or for conducting heat from the fluid or the coolant toward said inner tube or said outer tube.

5. A motor vehicle, comprising:
an internal combustion engine;
an exhaust gas line connected to said internal combustion engine;
components; and
a thermoelectric generator according to claim 1 connected to said exhaust gas line for conducting a flow of exhaust gas through said plurality of modules, said thermoelectric generator configured to discharge the electrical current toward said components.

6. A motor vehicle, comprising:
an internal combustion engine;
an exhaust gas line connected to said internal combustion engine;
an exhaust gas recirculation line connected between said exhaust gas line and said internal combustion engine;
components; and
a thermoelectric generator according to claim 1 disposed in said exhaust gas recirculation line, said thermoelectric generator configured to discharge the electrical current toward said components.

* * * * *